(12) United States Patent
Zhao et al.

(10) Patent No.: US 8,741,687 B2
(45) Date of Patent: Jun. 3, 2014

(54) PHOTOVOLTAIC DEVICE WITH CRYSTALLINE LAYER

(75) Inventors: Zhibo Zhao, Novi, MI (US); Dale Roberts, Temperance, MI (US); Yu Yang, Perrysburg, OH (US); Douglas Dauson, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/049,551

(22) Filed: Mar. 16, 2011

(65) Prior Publication Data
US 2011/0227131 A1 Sep. 22, 2011

Related U.S. Application Data

(60) Provisional application No. 61/315,199, filed on Mar. 18, 2010.

(51) Int. Cl.
*H01L 21/00* (2006.01)

(52) U.S. Cl.
USPC ............ 438/95; 438/69; 438/86; 438/98; 257/E31.126; 136/244; 136/256

(58) Field of Classification Search
CPC . H01L 31/0224; H01L 31/0392; H01L 31/18; H01L 31/109; H01L 31/1884; H01L 31/022466; H01L 31/073; H01L 31/1864
USPC .......... 438/95, 48, 57, 93; 257/184, E31.067; 136/256, 260, 265
See application file for complete search history.

(56) References Cited

U.S. PATENT DOCUMENTS

| | | | | |
|---|---|---|---|---|
| 3,811,953 A | * | 5/1974 | Nozik | 136/256 |
| 6,137,048 A | * | 10/2000 | Wu et al. | 136/260 |
| 6,288,325 B1 | * | 9/2001 | Jansen et al. | 136/249 |
| 2005/0009228 A1 | * | 1/2005 | Wu et al. | 438/95 |
| 2008/0210303 A1 | * | 9/2008 | Lu et al. | 136/260 |
| 2009/0121211 A1 | * | 5/2009 | Mitzi et al. | 257/4 |
| 2009/0194157 A1 | * | 8/2009 | den Boer et al. | 136/256 |
| 2010/0071810 A1 | * | 3/2010 | Nadaud et al. | 148/400 |
| 2010/0260986 A1 | * | 10/2010 | Ito | 428/212 |

FOREIGN PATENT DOCUMENTS

| | | |
|---|---|---|
| DE | 27 55 468 B1 | 5/1979 |
| GB | 1 519 733 A | 8/1978 |
| WO | WO 98/47702 A1 | 10/1998 |
| WO | WO 2011/005474 A1 | 1/2011 |

\* cited by examiner

*Primary Examiner* — George Fourson, III
*Assistant Examiner* — Wilner Jean Baptiste
(74) *Attorney, Agent, or Firm* — Dickstein Shapiro LLP

(57) ABSTRACT

A method for manufacturing a multilayered structure may include forming a transparent conductive oxide layer including cadmium stannate adjacent to a substrate and annealing the structure in an annealing environment including a reducing agent at a temperature greater than 500 degrees C. to crystallize the cadmium stannate.

31 Claims, 2 Drawing Sheets

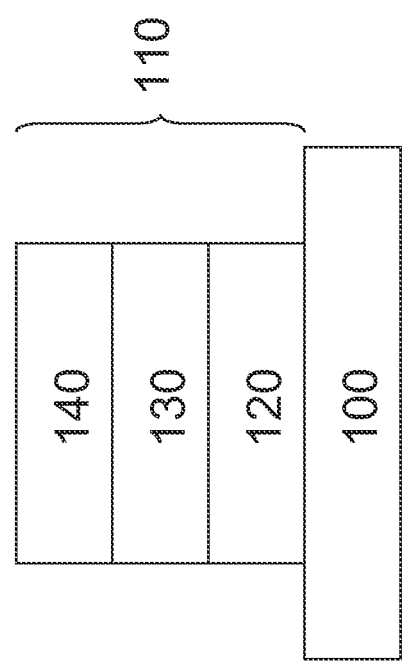

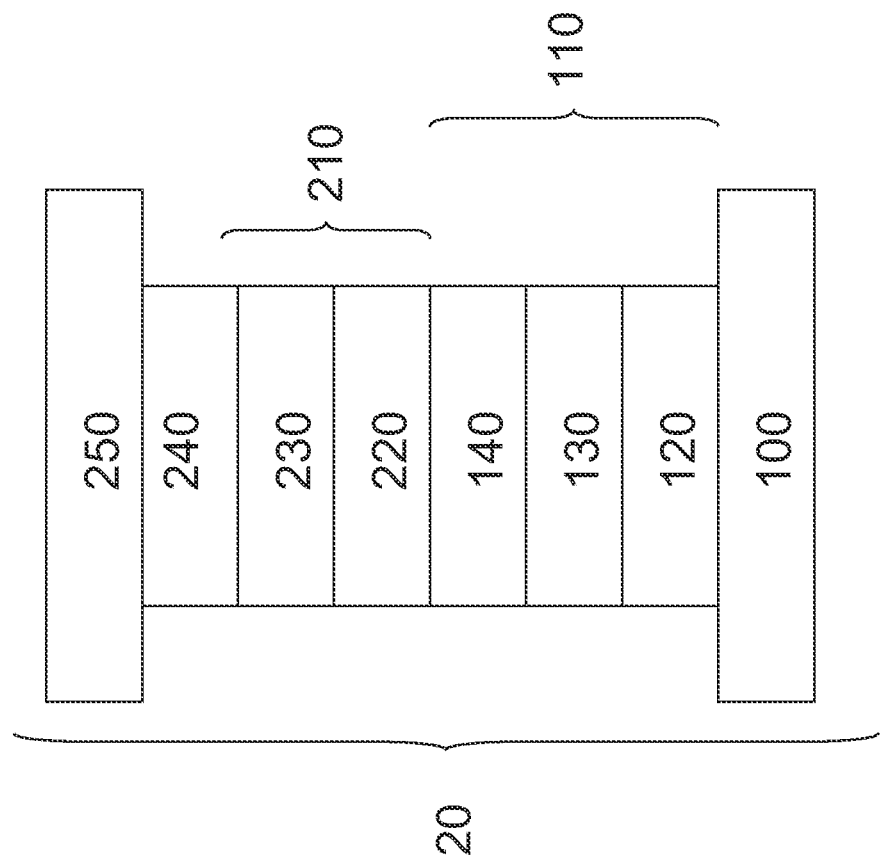

US 8,741,687 B2

PHOTOVOLTAIC DEVICE WITH CRYSTALLINE LAYER

CROSS-REFERENCE TO RELATED APPLICATIONS

This application claims priority to U.S. Provisional Application Ser. No. 61/315,199, which was filed on Mar. 18, 2010, and is herein incorporated by reference in its entirety.

TECHNICAL FIELD

The present invention relates to photovoltaic devices and methods of production.

BACKGROUND

Photovoltaic devices can include layers of materials, including, for example, a semiconductor layer adjacent to a transparent conductive oxide layer. The semiconductor layer can include a semiconductor window layer and a semiconductor absorber layer. Past photovoltaic devices have been inefficient at converting light energy to electrical power.

DESCRIPTION OF DRAWINGS

FIG. 1 is a schematic of a multilayered substrate.
FIG. 2 is a schematic of a photovoltaic device having multiple layers.

DETAILED DESCRIPTION

Photovoltaic devices can include multiple layers formed on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer formed on the buffer layer and a second film including a semiconductor absorber layer formed on the semiconductor window layer. Additionally, each layer can cover all or a portion of the device and/or all or a portion of the layer or substrate underlying the layer. For example, a "layer" can mean any amount of any material that contacts all or a portion of a surface. An annealing step can be included in the process of manufacturing a photovoltaic device.

In one aspect, method for manufacturing a structure can include forming a transparent conductive oxide layer adjacent to a substrate. The transparent conductive oxide layer can include cadmium stannate. The method can include annealing the structure in an annealing environment. The annealing environment can include a reducing agent and can have a temperature greater than 500 degrees C. The annealing step can crystallize the cadmium stannate in the transparent conductive oxide layer. The method can include forming a buffer layer adjacent to the transparent conductive oxide layer before annealing the structure, wherein the buffer layer comprises tin oxide and wherein the tin oxide is crystallized after the step of annealing the structure. The method can include forming a semiconductor window layer adjacent to the buffer layer and a semiconductor absorber layer adjacent to the semiconductor absorber layer, wherein the semiconductor window layer comprises cadmium sulfide and the semiconductor absorber layer comprises cadmium telluride.

The reducing agent can include forming gas. The reducing agent can include hydrogen. The reducing agent can include natural gas. The reducing agent can include nitrogen. The reducing agent can include nitrogen and hydrogen. The annealing environment can include oxygen. The concentration of oxygen in the annealing environment can be less than about 100 ppm. The hydrogen concentration of forming gas in the annealing environment can be less than about 1500 ppm. The hydrogen concentration of forming gas in the annealing environment can be between about 800 ppm and 1200 ppm. The hydrogen concentration of forming gas in the annealing environment can be between about 500 ppm and 1000 ppm. The hydrogen concentration of forming gas in the annealing environment can be between about 1 ppm and 500 ppm. The hydrogen concentration of forming gas in the annealing environment can be between about 100 ppm and 200 ppm. The annealing temperature can be between about 525 degrees C. and about 700 degrees C. The annealing temperature can be between about 550 degrees C. and about 600 degrees C. The annealing temperature can be between about 575 degrees C. and about 625 degrees C. The annealing temperature can be between about 600 degrees C. and about 650 degrees C. The annealing temperature can be below about 800 C, or below about 700 C.

The method can include monitoring and adjusting a concentration of oxygen in the annealing environment during the step of annealing. The method can include monitoring and adjusting a concentration of hydrogen in the annealing environment during the step of annealing. The step of annealing can have a duration of between about 1 minute and about 60 minutes. The step of annealing can have a duration of between about 20 minutes and about 40 minutes. The step of annealing can have a duration of between about 10 minutes and about 30 minutes. The step of annealing can have a duration of between about 1 minute and about 15 minutes.

In one aspect, a method for manufacturing a structure can include forming a barrier layer adjacent to a substrate. The substrate can include soda-lime glass and solar float glass with reduced iron content and thus increased optical transparency. The barrier layer can include a silicon oxide or a silicon nitride, for example, a doped or undoped silicon oxide or silicon nitride. The method can include forming a transparent conductive oxide layer adjacent to the barrier layer. The transparent conductive oxide layer can include cadmium stannate. The method can include forming a buffer layer adjacent to the transparent conductive oxide layer. The buffer layer can include tin oxide. The method can include annealing the structure in an annealing environment. The annealing environment can include forming gas. The annealing environment can have a temperature greater than 500 degrees C. After annealing the cadmium stannate of the transparent conductive oxide layer and/or the tin oxide of the buffer layer can be crystallized.

The method can include forming a semiconductor window layer including cadmium sulfide adjacent to the buffer layer, forming a semiconductor absorber layer including cadmium telluride adjacent to the semiconductor window layer, and forming a back contact adjacent to the semiconductor absorber layer. The hydrogen concentration of forming gas in the annealing environment can be less than about 1500 ppm. The annealing temperature can be between about 525 degrees C. and about 700 degrees C. The step of annealing can have a duration of between about 1 minute and about 60 minutes.

A structure can include a barrier layer adjacent to a substrate and a transparent conductive oxide layer adjacent to the barrier layer. The transparent conductive oxide layer can include annealed, crystallized cadmium stannate. The structure can include a buffer layer adjacent to the transparent conductive oxide layer. The buffer layer can include annealed, crystallized tin oxide. The structure can include a semiconductor window layer adjacent to the buffer layer and a semiconductor absorber layer adjacent to the semiconductor window layer. The semiconductor window layer can include cadmium sulfide and the semiconductor absorber layer can include cadmium telluride. The structure can include a back contact layer adjacent to the semiconductor absorber layer.

Referring to FIG. 1, by way of example, barrier layer 120 may be deposited onto substrate 100. Substrate 100 may include any suitable material, including, for example, a glass. The glass may include a soda-lime glass, or any glass with reduced iron content. Barrier layer 120 may be formed adjacent to substrate 100 and can include one or more barrier materials formed in one or more layers. Barrier layer 120 can be incorporated between substrate 100 and transparent conductive oxide (TCO) layer 130 to lessen diffusion of sodium or other contaminants from substrate 100 to a semiconductor window layer and/or semiconductor absorber layer, which could result in degradation or delamination. Barrier layer 120 can be transparent, thermally stable, with a reduced number of pin holes and having high sodium-blocking capability, and good adhesive properties. Barrier layer 120 can include any suitable material, including any suitable silicon oxide or silicon nitride. Barrier layer 120 can include a doped or undoped silicon oxide or a doped or undoped silicon nitride. Barrier layer 120 can include a silicon nitride, silicon oxide, aluminum-doped silicon oxide, boron-doped silicon nitride, phosphorus-doped silicon nitride, silicon oxide-nitride, or any combination or alloy thereof. The dopant can be less than 25%, less than 20%, less than 15%, less than 10%, less than 5% or less than 2%. Barrier layer 120 can be optimized using optical modeling to achieve both color suppression and reduced reflection loss while acting effectively as a barrier to a material such as sodium. Barrier layer 120 may have any suitable thickness, including, for example, between about 1 A and 5000 A, more than about 500 A, more than about 750 A, or less than about 1200 A. For example, barrier layer 120 may have a thickness of about 1000 A. Barrier layer 120 may be deposited using any suitable technique, including, for example, sputtering. Barrier layer 120 may be deposited in the presence of one or more gases, for example, an oxygen gas. An argon gas may be added to the deposition chamber to increase the rate of deposition. The incorporation of argon into the deposition process can result in a higher deposition rate for barrier layer 120.

A transparent conductive oxide layer 130 can be formed adjacent to barrier layer 120. Transparent conductive oxide layer 130 as deposited may include any suitable material, including, for example, an amorphous layer of cadmium stannate. Cadmium stannate functions well in this capacity, as it exhibits high optical transmission and low electrical sheet resistance. Transparent conductive oxide layer 130 may have any suitable thickness, including about 1 A to about 5000 A, more than about 2000 A, more than about 2500 A, or less than about 3000 A. For example, transparent conductive oxide layer 130 may have a thickness of about 2600 A. Transparent conductive oxide layer 130 may be deposited using any suitable means, including, for example, sputtering. Like barrier layer 120, transparent conductive oxide layer 130 may be deposited at an enhanced rate by incorporating argon gas into the deposition environment. For example, transparent conductive oxide layer 130 may be deposited in the presence of an oxygen/argon gas mix. An argon content in barrier layer 120 and transparent conductive oxide layer 130 may be detectable following deposition.

Buffer layer 140 may be deposited onto transparent conductive oxide layer 130. Buffer layer 140 can decrease the likelihood of irregularities occurring during the formation of a semiconductor window layer formed adjacent to TCO layer 130. Buffer layer 140 can include various suitable materials, including tin oxide, zinc tin oxide, zinc oxide, and zinc magnesium oxide. Buffer layer 140 as deposited may include an amorphous tin oxide. Buffer layer can include doped oxides of Sn, Zn and SnZn alloy to affect buffer resistivity and surface properties. Buffer layer 140 may have any suitable thickness, including, for example, about 1 A to about 5000 A, more than about 500 A, more than about 650 A, more than about 800 A, or less than about 1200 A. For example, buffer layer 140 may have a thickness of about 900 A. Buffer layer 140 may be deposited using any suitable means, including, for example, sputtering. For example, buffer layer 140 may include a tin oxide sputtered in the presence of an oxygen gas, using a sputter target including tin. Buffer layer 140, along with barrier layer 120 and transparent conductive oxide layer 130, can form transparent conductive oxide stack 110.

The layers included in the structure and photovoltaic device can be created using any suitable technique or combination of techniques. For example, the layer can be formed by low pressure chemical vapor deposition, atmospheric pressure chemical vapor deposition, plasma-enhanced chemical vapor deposition, thermal chemical vapor deposition, DC, DC pulsed or AC sputtering, spin-on deposition, and spray-pyrolysis. Each deposition layer can be of any suitable thickness, for example in the range of about 1 to about 5000 A.

The deposition rate of the layers in TCO stack 110 (e.g., barrier layer 120, TCO layer 130, and buffer layer 140) may be expedited by incorporating an argon gas into the deposition chamber, in addition to oxygen gas. For example, barrier layer 120 and/or TCO layer 130 can be sputtered in the presence of an oxygen/argon gas mix to facilitate the deposition process. Barrier layer 120 can be formed adjacent to substrate 100, which may include a glass such as soda-lime glass or a glass with a reduced iron content. Substrate 100 may have one or more rounded edges to enable it to withstand high anneal temperatures (e.g., about 600 degrees C.). TCO layer 130 may have a low roughness to facilitate smooth semiconductor window layer (e.g., cadmium sulfide) formation, thereby resulting in greater control of the semiconductor window layer (e.g., cadmium sulfide)/semiconductor absorber layer (e.g., cadmium telluride) junction interface. The optimal levels of sheet resistance of TCO layer 130 may be controlled by adjusting TCO layer thickness and/or annealing conditions. TCO layer 130, which may include cadmium stannate, for example, may be deposited adjacent to barrier layer 120, in the presence of an oxygen/argon gas mix. The incorporation of argon during the sputtering of barrier layer 120 and TCO layer 130 can increase the deposition rate by multiple folds.

Barrier layer 120, TCO layer 130, and/or buffer layer 140 can be formed by sputtering respective sputter targets including suitable sputter materials. For example, if barrier layer 120 includes silicon aluminum oxide (e.g., $SiAlO_x$), the sputter target can include suitable amounts of silicon and aluminum. The sputter target can be sputtered in an oxygen-containing environment. For example, the target can have a silicon:aluminum ratio in the range of 95:5 to 65:35. The target can have a silicon:aluminum ratio in the range of 80:20 to 85:15. A sputter target for creating a cadmium stannate transparent conductive oxide layer can include cadmium and tin. A sputter target for forming buffer layer 140 can include tin and can be sputtered in an oxygen-containing environment to form a tin oxide-containing buffer layer.

A sputter target used for any of the above-described device layers can be manufactured by any suitable technique or combination of techniques. A sputter target can be manufactured as a single piece in any suitable shape. A sputter target can be a tube. A sputter target can be manufactured by casting a material into any suitable shape, such as a tube. A sputter target can be manufactured from more than one piece. The pieces can be manufactured in any suitable shape, such as sleeves, and can be joined or connected in any suitable manner or configuration. A sputter target can be manufactured by powder metallurgy. A sputter target can be formed by consolidating powder to form the target. The powder can be consolidated in any suitable process (e.g., pressing such as isostatic pressing) and in any suitable shape. The consolidating can occur at any suitable temperature. A sputter target can be formed from powder including more than one material powder. More than one powder can be present in stoichiometrically proper amounts.

Sputter targets (including rotary sputter targets) can include a sputter material used in connection with a backing material. The backing material can include stainless steel. The backing material can include a backing tube. The backing material can include a stainless steel backing tube. A sputter target can be manufactured by positioning wire including target material adjacent to a base. For example wire including target material can be wrapped around a base tube. The wire can include multiple materials present in stoichiometrically proper amounts. The base tube can be formed from a material that will not be sputtered. The wire can be pressed (e.g., by isostatic pressing). A sputter target can be manufactured by spraying a sputter material onto a base. Sputter material can be sprayed by any suitable spraying process, including thermal spraying and plasma spraying. The base onto which the target material is sprayed can be a tube.

Following deposition, transparent conductive oxide stack 110 can be annealed to form annealed stack 210 from FIG. 2, which can include crystallized cadmium stannate in annealed TCO layer 130. Buffer layer 140 can also be annealed as part of TCO stack 110 with the result that annealed buffer layer 140 can include a crystallized component, such as crystallized tin oxide. Transparent conductive oxide stack 110 can be annealed using any suitable annealing process. The annealing environment can include any suitable materials to generate proper ambient annealing condition to transform cadmium stannate to high transmission and low resistivity oxides. For example, the annealing environment can include a reducing agent. The reducing agent can include, for example, fowling gas, hydrogen, nitrogen, a hydrogen-nitrogen mix, a natural gas, or any other suitable material or combination of suitable materials. Forming gas—includes a mixture of hydrogen and nitrogen, including from about 1 mol. % to about 5.7 mol. % hydrogen. Forming gas can include hydrogen gas and nitrogen gas. Forming gas can include a dissociated ammonia atmosphere. The reducing agent can include any suitable natural gas, which can include methane and other alkanes (e.g., ethane, propane, butane, or pentane) and other components (e.g., carbon dioxide, nitrogen, helium, or hydrogen sulfide).

The hydrogen concentration of forming gas in the annealing environment can be, for example, more than about 100 ppm, more than about 500 ppm, more than about 750 ppm, less than about 1500 ppm, or less than about 1000 ppm. The hydrogen concentration of forming gas in the annealing environment can be, for example, between about 800 ppm and 1200 ppm, between about 500 ppm and 1000 ppm, between about 1 ppm and 500 ppm, between about 100 ppm and 200 ppm. The annealing environment may include an oxygen content of less than about 100 ppm, for example, less than about 50 ppm. Transparent conductive oxide stack 110 can be annealed under any suitable pressure, for example, under reduced pressure, in a low vacuum, or at about 0.01 Pa ($10^{-4}$ Torr). The concentration of any suitable material in the annealing environment (e.g., oxygen or hydrogen) can be monitored and adjusted by any suitable means during the anneal.

Transparent conductive oxide stack 110 can be annealed at any suitable temperature or temperature range. For example, transparent conductive oxide stack 110 can be annealed above about 380 C, above about 400 C, above about 500 C, above about 600 C, or below about 800 C. For example, transparent conductive oxide stack 110 can be annealed at about 400 C to about 800 C or about 500 C to about 700 C. TCO stack 110 can be annealed between about 525 degrees C. and about 700 degrees C. When there is a concentration of forming gas between about 1 ppm and 500 ppm, the anneal temperature can be between about 550 degrees C. and about 600 degrees C. For example, when the concentration of forming gas is about 1 ppm, the anneal temperature can be about 570 degrees C. When the hydrogen concentration of forming gas is between about 100 ppm and about 200 ppm, the anneal temperature can be between about 575 degrees C. and about 625 degrees C. For example, when the hydrogen concentration of fowling gas in the anneal environment is about 160 ppm, the anneal temperature can be about 600 degrees C. When the hydrogen concentration of forming gas is between about 800 ppm and about 1200 ppm, the anneal temperature can be between about 600 degrees C. and about 650 degrees C. For example, when the hydrogen concentration of forming gas in the annealing environment is about 1000 ppm, the anneal temperature can be about 625 degrees C.

Transparent conductive oxide stack 110 can be annealed for any suitable duration. The annealing step can have duration of between 1 minute and 60 minutes. Transparent conductive oxide stack 110 can be annealed for more than about 10 minutes, more than about 20 minutes, more than about 30 minutes, or less than about 40 minutes. The duration can be from about 20 minutes to about 40 minutes. The duration of the anneal can be between about 10 minutes and about 30 minutes. Transparent conductive oxide stack 110 can be annealed for about 15 to about 20 minutes. The annealing step can have a duration of about 1 minute to about 15 minutes.

Annealed transparent conductive oxide stack 210 can be used to form photovoltaic device 20 from FIG. 2. Referring to FIG. 2, a semiconductor window layer 220 can be deposited directly onto annealed transparent conductive oxide stack 210. Semiconductor window layer 220 can include any suitable material, including, for example, a cadmium sulfide. Semiconductor window layer 220 can be deposited using any known deposition technique, including vapor transport deposition. Semiconductor window layer 220 can have any suitable thickness, including, for example, more than about 25 Å, or less than about 100 A, for example, about 50 A. Semiconductor absorber layer 230 can include a cadmium telluride layer. Semiconductor absorber layer 230 can be deposited onto semiconductor window layer 220. Semiconductor absorber layer 230 can be deposited using any known deposition technique, including vapor transport deposition. Semiconductor window layer 220 and semiconductor absorber layer 230, together, can form semiconductor layer 210, which may be deposited directly onto annealed transparent conductive oxide stack 210. A back contact 240 can be deposited onto semiconductor layer 200. Back contact 240 can be deposited onto semiconductor absorber layer 230. A back support 250 can be deposited onto back contact 240.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method for manufacturing a structure comprising:
   forming a transparent conductive oxide layer over a substrate, wherein the transparent conductive oxide layer comprises cadmium stannate;
   forming a buffer layer comprising tin oxide over the transparent conductive oxide layer; and
   annealing the structure in an annealing environment comprising a reducing agent at a temperature greater than 500 degrees C. to crystallize the cadmium stannate and tin oxide.

2. The method of claim 1 further comprising, subsequent to the annealing, forming a semiconductor window layer over the buffer layer and a semiconductor absorber layer over the semiconductor window layer, wherein the semiconductor window layer comprises cadmium sulfide and the semiconductor absorber layer comprises cadmium telluride.

3. The method of claim 2, wherein the semiconductor window layer is adjacent to the buffer layer and the semiconductor absorber layer is adjacent to the semiconductor window layer.

4. The method of claim 1, wherein the reducing agent comprises forming gas.

5. The method of claim 1, wherein the reducing agent comprises hydrogen.

6. The method of claim 4, wherein the hydrogen concentration of forming gas in the annealing environment is less than about 1500 ppm.

7. The method of claim 4, wherein the hydrogen concentration of forming gas in the annealing environment is between about 800 ppm and 1200 ppm.

8. The method of claim 4, wherein the hydrogen concentration of forming gas in the annealing environment is between about 500 ppm and 1000 ppm.

9. The method of claim 4, wherein the hydrogen concentration of forming gas in the annealing environment is between about 1 ppm and 500 ppm.

10. The method of claim 9, wherein the annealing temperature is between about 550 degrees C. and about 600 degrees C.

11. The method of claim 4, wherein the hydrogen concentration of forming gas in the annealing environment is between about 100 ppm and 200 ppm.

12. The method of claim 11, wherein the annealing temperature is between about 575 degrees C. and about 625 degrees C.

13. The method of claim 7, wherein the annealing temperature is between about 600 degrees C. and about 650 degrees C.

14. The method of claim 5, wherein the reducing agent comprises natural gas.

15. The method of claim 1, wherein the reducing agent comprises nitrogen.

16. The method of claim 1, wherein the reducing agent comprises nitrogen and hydrogen.

17. The method of claim 1, wherein the annealing environment further comprises oxygen.

18. The method of claim 1, wherein the annealing temperature is between about 525 degrees C. and about 700 degrees C.

19. The method of claim 1, further comprising monitoring and adjusting a concentration of oxygen in the annealing environment during the step of annealing.

20. The method of claim 1, further comprising monitoring and adjusting a concentration of hydrogen in the annealing environment during the step of annealing.

21. The method of claim 1, wherein the step of annealing has a duration of between about 1 minute and about 60 minutes.

22. The method of claim 1, wherein the step of annealing has a duration of between about 20 minutes and about 40 minutes.

23. The method of claim 1, wherein the step of annealing has a duration of between about 10 minutes and about 30 minutes.

24. The method of claim 1, wherein the step of annealing has a duration of between about 1 minute and about 15 minutes.

25. The method of claim 1, wherein the transparent conductive oxide layer is adjacent to the substrate.

26. The method of claim 1, wherein the buffer layer is adjacent to the transparent conductive oxide layer.

27. A method for manufacturing a structure, the method comprising:
   forming a barrier layer adjacent to a substrate, wherein the substrate comprises soda-lime glass and the barrier layer comprises a material selected from the group consisting of a silicon oxide and a silicon nitride;
   forming a transparent conductive oxide layer adjacent to the barrier layer, wherein the transparent conductive oxide layer comprises cadmium stannate;
   forming a buffer layer adjacent to the transparent conductive oxide layer, wherein the buffer layer comprises tin oxide; and
   annealing the structure in an annealing environment comprising forming gas at a temperature greater than 500 degrees C. to crystallize the cadmium stannate in the transparent conductive oxide layer and the tin oxide in the buffer layer.

28. The method of claim 27, further comprising the steps of:
   subsequent to the annealing:
      forming a semiconductor window layer comprising cadmium sulfide adjacent to the buffer layer;
      forming a semiconductor absorber layer comprising cadmium telluride adjacent to the semiconductor window layer; and
      forming a back contact adjacent to the semiconductor absorber layer.

29. The method of claim 27, wherein the hydrogen concentration of forming gas in the annealing environment is less than about 1500 ppm.

30. The method of claim 27, wherein the annealing temperature is between about 525 degrees C. and about 700 degrees C.

31. The method of claim 27, wherein the step of annealing has a duration of between about 1 minute and about 60 minutes.

* * * * *